(12) United States Patent
Watanabe

(10) Patent No.: US 6,806,005 B2
(45) Date of Patent: Oct. 19, 2004

(54) METHOD AND APPARATUS FOR FORMING RESIST PATTERN

(75) Inventor: Minoru Watanabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 12 days.

(21) Appl. No.: 10/025,783

(22) Filed: Dec. 26, 2001

(65) Prior Publication Data

US 2002/0055049 A1 May 9, 2002

Related U.S. Application Data

(63) Continuation of application No. 09/443,500, filed on Nov. 19, 1999.

(51) Int. Cl.$^7$ .................................................. G03F 7/26
(52) U.S. Cl. ........................ 430/3; 430/311; 430/322; 134/1.3
(58) Field of Search ............................... 430/3, 311, 322, 430/330; 134/1, 1.3

(56) References Cited

U.S. PATENT DOCUMENTS

| | | | |
|---|---|---|---|
| 4,120,699 A | 10/1978 | Kennedy, Jr. et al. ......... 134/1 |
| 4,527,901 A | 7/1985 | Cook .......................... 366/127 |
| 4,547,455 A | * 10/1985 | Hiramoto ..................... 430/325 |
| 4,602,184 A | 7/1986 | Meitzler ...................... 310/322 |
| 5,496,411 A | 3/1996 | Candy .......................... 134/1 |
| 5,834,871 A | 11/1998 | Puskas ......................... 310/316 |
| 6,090,205 A | 7/2000 | Sakai et al. ................. 118/500 |
| 6,271,149 B1 | 8/2001 | Kondo et al. ................ 438/758 |
| 6,372,389 B1 | * 4/2002 | Watanabe ....................... 430/3 |

FOREIGN PATENT DOCUMENTS

| | | |
|---|---|---|
| JP | 06-049661 | 2/1994 |
| JP | 06-112119 | 4/1994 |
| JP | 08-314156 | 11/1996 |
| JP | 09-139345 | 5/1997 |
| JP | 10-289857 | 10/1998 |
| JP | 11-054427 | 2/1999 |

\* cited by examiner

*Primary Examiner*—Kathleen Duda
(74) *Attorney, Agent, or Firm*—Rabin & Berdo, P.C.

(57) ABSTRACT

A method of forming a resist pattern on a substrate, comprises the steps of: forming a resist film on the substrate, supplying a developing solution onto the resist film, submerging the substrate and the resist film formed thereon in a rinsing liquid kept in a rinsing tank, and applying ultrasonic vibration to the rinsing liquid to rinse the developing solution from the resist film submerged in the rinsing liquid.

26 Claims, 4 Drawing Sheets

MASK SIZE:0.20 μmL&S

METHOD AND APPARATUS FOR FORMING RESIST PATTERN

This application is a continuation of application Ser. No. 09/443,500, which was filed on Nov. 19, 1999.

BACKGROUND OF THE INVENTION

The present invention relates to a method and apparatus for forming a resist pattern on a substrate used in semiconductor fabrication processes and a resist pattern used for a photomask such as a reticle.

Recently, chemically amplified resist patterns are formed by means of the lithographic technique utilizing the KrF excimer laser exposure. Especially, negative resist, which provides unexposed portions that dissolve in developing solution, is important for super-resolution techniques (Levenson phase shift masks).

However, if chemically amplified negative resist is used to produce a line-and-space pattern 21, for instance, microbridges 22 that partially connect adjacent portions of the pattern are readily formed, as shown in FIG. 1, reducing yields.

SUMMARY OF THE INVENTION

An object of the present invention is to provide a method and apparatus for forming a resist pattern on a substrate, which suppresses generation of microbridges.

According to an aspect of the present invention, a method of forming a resist pattern on a substrate, comprises the steps of: forming a resist film on the substrate; supplying a developing solution onto the resist film; and submerging the substrate and the resist film formed thereon in a rinsing liquid kept in a rinsing tank; and applying ultrasonic vibration to the rinsing liquid to rinse the developing solution from the resist film submerged in the rinsing liquid.

According to another aspect of the present invention, an apparatus for forming a resist pattern on a substrate comprises: a rinsing tank which keeps rinsing liquid for rinsing developing solution remaining on a resist film formed on the substrate; and an ultrasonic vibration mechanism which applies ultrasonic vibration to the rinsing liquid kept in the rinsing tank.

BRIEF DESCRIPTION OF THE INVENTION

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

First Embodiment

FIGS. 2A to 2F are diagrams showing the steps of a process for forming a resist pattern according to a first embodiment of the present invention.

Figure 2A:
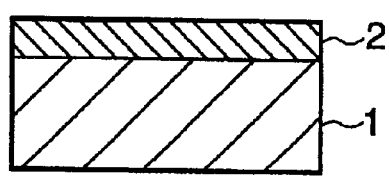
FIGS. 2A to 2F are diagrams showing the steps of a process for forming a resist pattern according to a first embodiment of the present invention.

In the first embodiment, a negative resist film 2 is first formed on a substrate 1 through spin coating or another method, as shown in FIG. 2A. The substrate 1 is a silicon substrate, for instance. The negative resist film 2 is made of chemically amplified negative resist, is about 0.5 $\mu$m thick, and is prebaked (PB) at about 110° C., for instance. However, the materials, thickness, and processing temperature of the substrate 1 and the negative resist film 2 are not limited to those described above. In addition, a positive resist film may be used instead of the negative resist film 2.

Figure 2B:
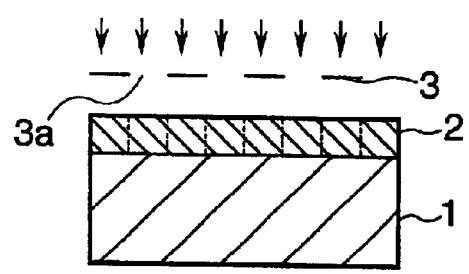

Next, as shown in FIG. 2B, the negative resist film 2 is exposed to light passing through the mask 3 having a desired pattern of openings 3a. The light exposure amounts to about 23 mJ/cm$^2$, for instance. The shape of the mask is not limited to the one shown in the figure, and the light exposure is not limited to the value indicated above.

Figure 2C:
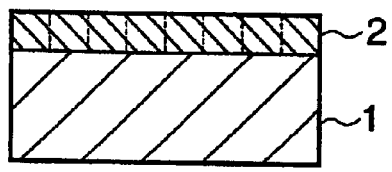

Then, as shown in FIG. 2C, the post exposure bake (PEB) processing is performed. The PEB processing is heat-up processing at about 105° C. The temperature of the PEB processing may be different from the value indicated above.

Figure 2D:
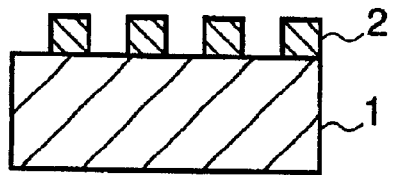

Next, as shown in FIG. 2D, developing solution is supplied to remove the unexposed portions of the negative resist film 2. The developing solution may be supplied by directing jets of developing solution through a nozzle or by submerging the substrate in the developing solution, for instance. The developing solution is, for example, a 2.38% tetramethylammonium hydroxide (TMAH) developing solution, which is an alkaline developing solution. The developing time is about 60 seconds, for instance. However, the developing solution and developing time are not limited to those indicated above.

Figure 2E:
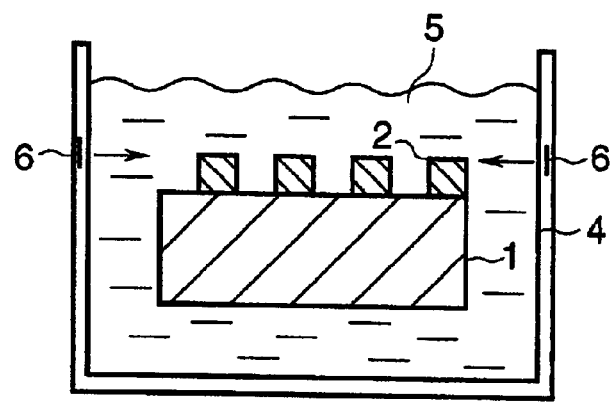

Then, as shown in FIG. 2E, the substrate 1 and the developed negative resist film 2 are submerged in pure water 5, which is the rinsing liquid kept in a rinsing tank 4, then ultrasonic vibration is applied to the pure water 5. The frequency of ultrasonic vibration ranges from 40 kHz to 50 kHz, for instance. The ultrasonic generator 6 is built in the wall structure of the rinsing tank (container) 4 filled with the pure water 5. The ultrasonic generator 6, however, may be provided inside or outside the container 4 and may also be disposed on a table on which the container 4 is placed. The ultrasonic frequency and ultrasonic processing time can be changed as desired by means of a controller (not shown).

Figure 2F:
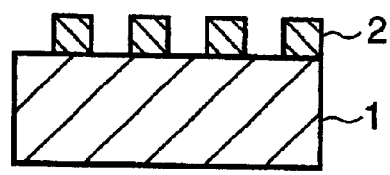

Then, as shown in FIG. 2F, the substrate 1 having the negative resist film 2 is taken out of the rinsing liquid and dried. In the drying step, the spin dry method is used, for instance.

Figure 1:
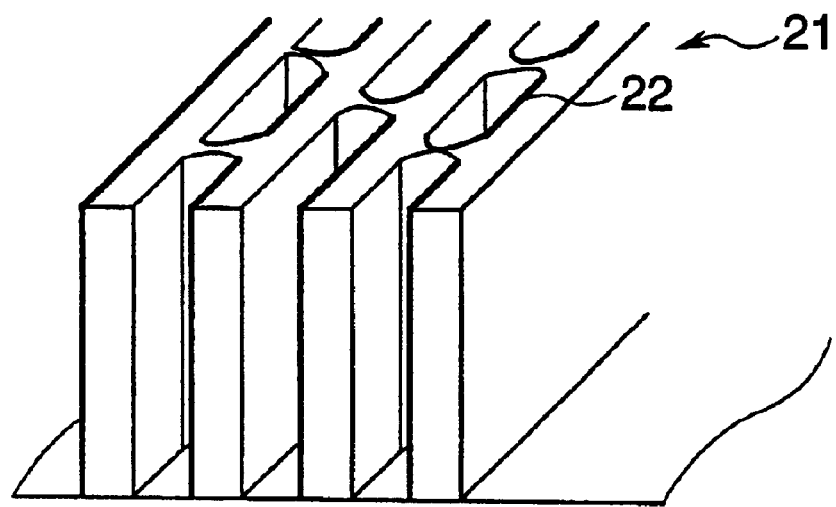
FIG. 1 is a perspective view showing microbridges that partially connect adjacent portions of the pattern.
Figure 3:
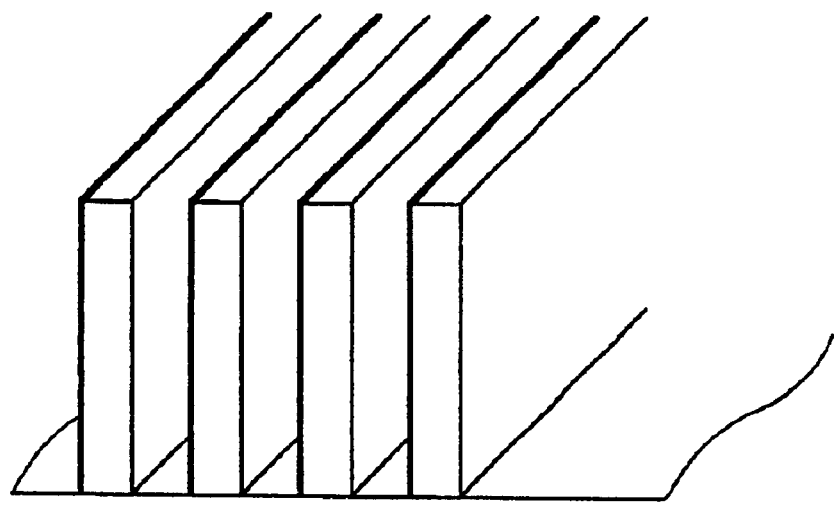
FIG. 3 is a perspective view showing a resist pattern free from microbridges.

As has been described above, the generation of microbridges can be suppressed through a quick and convenient method such as ultrasonic processing during rinsing, according to the first embodiment. As a result, a resist pattern free from microbridges can be formed, as shown in FIG. 3. Moreover, by combining the ultrasonic processing unit and the pure water processing unit into a single unit, the throughput can be improved.

Figure 4A:
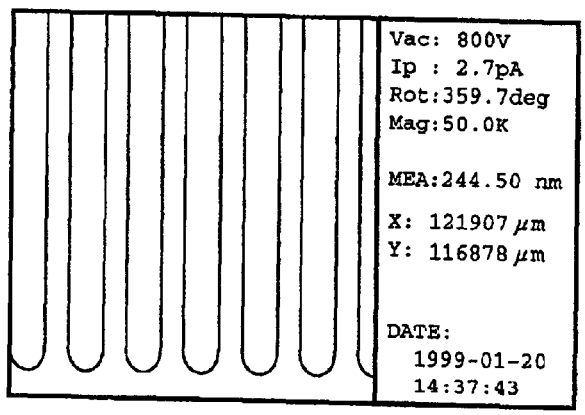
FIGS. 4A and 4B are diagrams showing schematic views of a pattern formed through the rinsing step in which ultrasonic vibration is applied (the first embodiment) and a pattern formed through the conventional method.
Figure 4B:
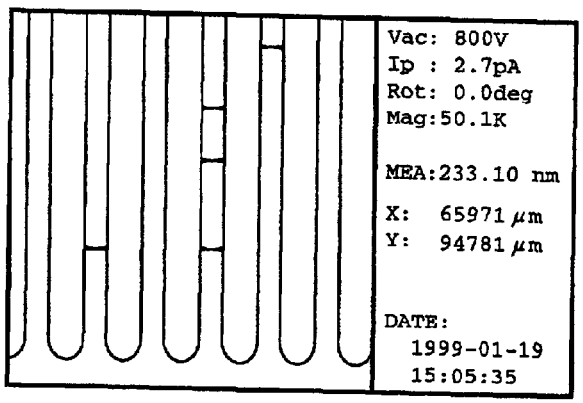

FIGS. 4A and 4B are diagrams showing schematic views of a pattern formed through the rinsing step in which ultrasonic vibration is applied (pattern formed according to the first embodiment) and a pattern formed through the rinsing step in which no ultrasonic vibration is applied (pattern formed by the conventional method). In the experiment for forming the pattern shown in FIG. 4A, the silicon substrate is applied with a layer of commercially available chemically amplified negative resist of about 0.5 $\mu$m thick, a resist film is formed through the PB processing at about 110° C. and exposed to light of about 23 mJ/cm$^2$, then the PEB processing is performed at about 105° C. In the developing step, a 2.38% TMAH developing solution is used as the alkaline developing solution, and a developing time of about 60 seconds is taken. In the rinsing step, the wafer is submerged in the pure water, and ultrasonic vibration of about 40 kHz to 50 kHz is applied. The compared example shown in FIG. 4B is formed by applying a layer of commercially available chemically amplified negative resist of about 0.5 $\mu$m thick on a silicon substrate, forming a resist film through the PB processing at about 110° C., exposing to light of about 23 mJ/cm$^2$, and performing the PEB processing at about 105° C. In the developing step, a 2.38% TMAH developing solution is used as the alkaline developing solution, and a developing time of about 60 seconds is taken. In the rinsing step, the wafer is submerged in the pure water, and no ultrasonic vibration is applied. This experiment proves that the generation of microbridges is suppressed by performing ultrasonic processing during rinsing.

Figure 5:
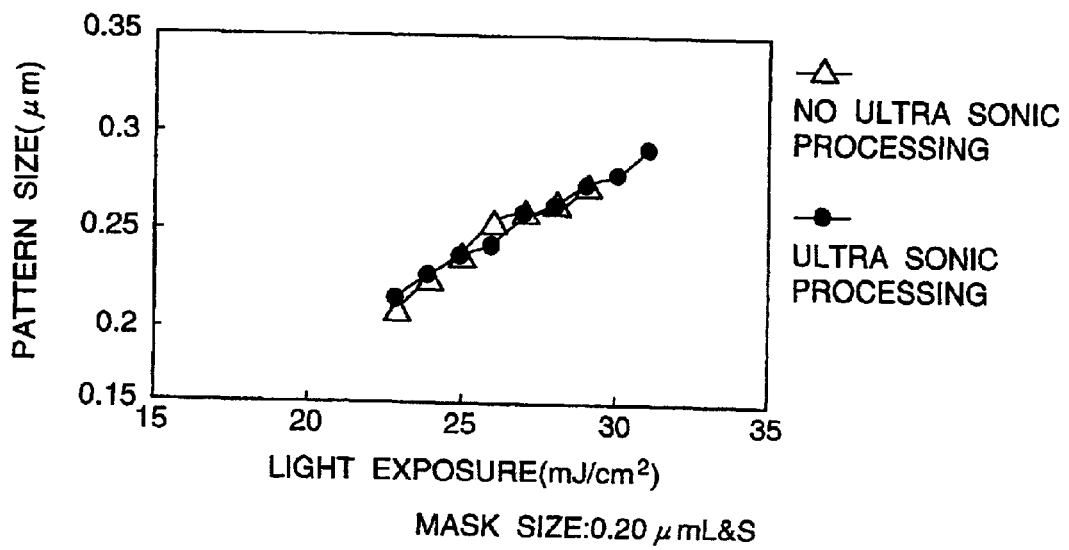
FIG. 5 shows the relationship between light exposure (mJ/cm$^2$) and pattern dimensions ($\mu$m) in the process for forming a resist pattern, depending on the ultrasonic processing.

FIG. 5 shows the relationship between light exposure (mJ/cm$^2$) and pattern dimensions ($\mu$m) in the process for forming a resist pattern, depending on the ultrasonic processing. In the figure, white triangles represent data taken when no ultrasonic processing is performed in rinsing (compared example shown in FIG. 4B) while black circles represent data taken when ultrasonic vibration is applied in rinsing (example shown in FIG. 4A according to the first embodiment). This experiment proves that the light exposure margin, which has a great effect on manufacturing yield, has also increased according to the first embodiment.

In the description above, the ultrasonic processing is performed in rinsing only, but the ultrasonic-processing may be performed during the developing step.

Second Embodiment

FIGS. 6A to 6E are diagrams showing the steps of a process for forming a resist pattern according to a second embodiment of the present invention. With the second embodiment, a process for producing a photomask such as a reticle is described.

Figure 6A:
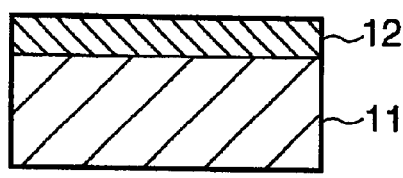
FIGS. 6A to 6E are diagrams showing the steps of a process for forming a resist pattern according to a second embodiment of the present invention.
Figure 6D:
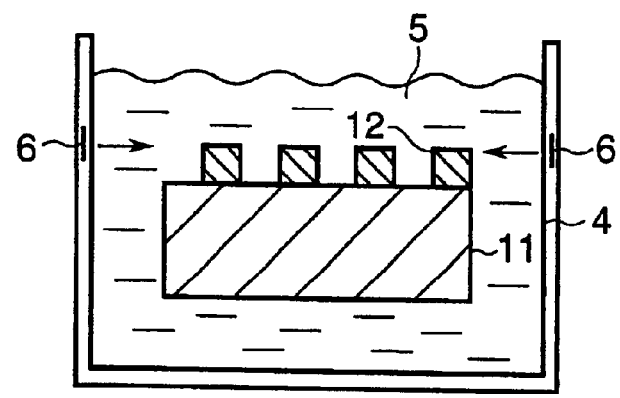
Figure 6B:
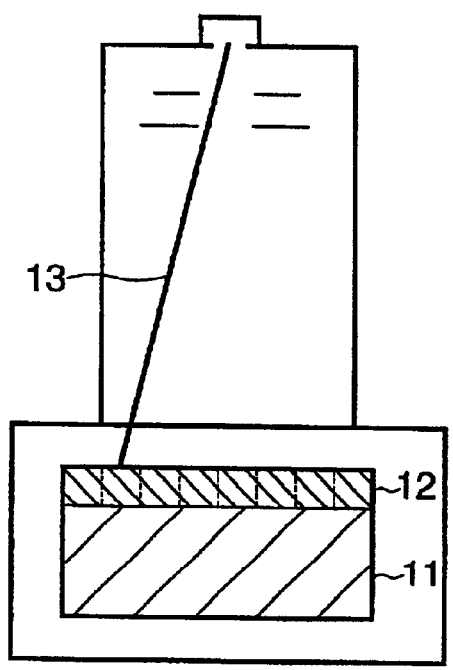
Figure 6E:
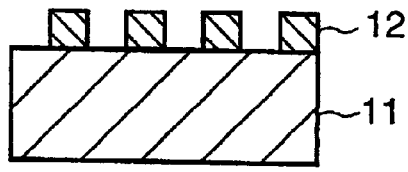
Figure 6C:
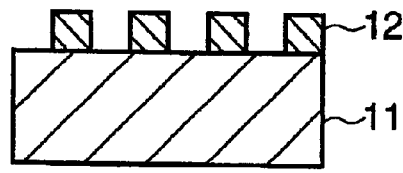

First, as shown in FIG. 6A, a negative resist film 12 is formed on a quartz substrate 11 through spin coating or another method, and then the PB processing is performed. Then, as shown in FIG. 6B, the electron beam (EB) lithography technique is used to irradiate the negative resist film 12 with a dose of electron beam 13, and the PEB processing is performed. Next, as shown in FIG. 6C, developing solution is supplied, and unexposed portions of the negative resist film 12 are removed. Then, as shown in FIG. 6D, the quartz substrate 11 and the developed negative resist film 12 are submerged in pure water 5, which is a rinsing liquid kept in the rinsing tank 4, and ultrasonic vibration is applied to the pure water. Next, as shown in FIG. 6E, the quartz substrate 11 having the negative resist film 12 is taken out of the rinsing liquid and dried.

As has been described above, the generation of microbridges can be suppressed by a quick and convenient method such as the ultrasonic processing during rinsing, according to the second embodiment. Consequently, a mask made from a resist pattern without microbridges can be formed, as shown in FIG. 3. The mask with few microbridges can be used for forming a 4 times reticle, for optical proximity correction (OPC), and for the like.

The second embodiment is the same as the first embodiment except for the items described above.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A method of forming a resist pattern on a semiconductor substrate, comprising:
   forming a resist film on the semiconductor substrate;
   baking the resist film at a first temperature;
   exposing the resist film to light passing through a mask after baking the resist film at the first temperature;
   baking the resist film at a second temperature after exposing the resist film to the light, wherein the second temperature is different from the first temperature;
   supplying a developing solution on the resist film to remove the resist film, wherein a portion of the resist film remains on the semiconductor substrate; and
   rinsing the developing solution from the portion of the resist film by a rinsing liquid to which ultrasonic vibration is applied.

2. The method according to claim 1, wherein the developing solution is an alkaline developing solution.

3. The method according to claim 2, wherein the alkaline developing solution includes tetramethylammonium hydroxide.

4. The method according to claim 1, wherein the second temperature is lower than the first temperature.

5. The method according to claim 1, wherein the ultrasonic vibration is applied to the developing solution.

6. The method according to claim 1, wherein the rinsing liquid is pure water.

7. The method of claim 1, wherein the ultrasonic vibration ranges from 40 kHz to 50 kHz.

8. A method of forming a resist pattern on a semiconductor substrate, comprising:
   forming a resist film on the semiconductor substrate;
   baking the resist film at a first temperature;
   irradiating the resist film with an electron beam using an electron beam lithography technique after baking the resist film at the first temperature;
   baking the resist film at a second temperature after irradiating the resist film with the electron beam, wherein the second temperature is different from the first temperature;
   supplying a developing solution on the resist film to remove the resist film, wherein a portion of the resist film remains on the semiconductor substrate; and
   rinsing the developing solution from the portion of the resist film by a rinsing liquid to which ultrasonic vibration is applied.

9. The method according to claim 8, wherein the second temperature is lower than the first temperature.

10. The method according to claim 8, wherein the ultrasonic vibration is applied to the developing solution.

11. The method according to claim 8, wherein the rinsing liquid is pure water.

12. A method for fabricating a semiconductor device, comprising:

preparing a semiconductor substrate;

forming a resist film on the semiconductor substrate;

baking the resist film at a first temperature;

exposing the resist film to light passing through a mask after baking the resist film at the first temperature;

baking the resist film at a second temperature after exposing the resist film to the light, wherein the second temperature is different from the first temperature;

supplying a developing solution on the resist film for patterning the resist film, whereby a patterned resist film is formed on the semiconductor substrate;

providing a rinsing liquid on the semiconductor substrate on which the patterned resist film is formed; and applying ultrasonic vibration to the rinsing liquid.

13. The method according to claim 12, wherein the developing solution is an alkaline developing solution.

14. The method according to claim 13, wherein the alkaline developing solution includes tetramethylammonium hydroxide.

15. The method according to claim 12, wherein the second temperature is lower than the first temperature.

16. The method according to claim 12, wherein the ultrasonic vibration is applied to the developing solution.

17. The method according to claim 12, wherein the rinsing liquid is pure water.

18. The method according to claim 12, wherein the ultrasonic vibration ranges from 40 kHz to 50 kHz.

19. A method for fabricating a semiconductor device, comprising:

preparing a semiconductor substrate;

forming a resist film on the semiconductor substrate;

baking the resist film at a first temperature;

irradiating the resist film with an electron beam using an electron beam lithography technique after baking the resist film at the first temperature;

baking the resist film at a second temperature after irradiating the resist film with the electron beam, wherein the second temperature is different from the first temperature;

supplying a developing solution on the resist film for patterning the resist film, whereby a patterned resist film is formed on the semiconductor substrate;

providing a rinsing liquid on the semiconductor substrate on which the patterned resist film is formed; and applying ultrasonic vibration to the rinsing liquid.

20. The method according to claim 19, wherein the second temperature is lower than the first temperature.

21. The method according to claim 19, wherein the ultrasonic vibration is applied to the developing solution.

22. The method according to claim 19, wherein the rinsing liquid is pure water.

23. A method of forming a resist pattern on a substrate, comprising:

forming a resist film on the substrate;

baking the resist film at a first temperature;

exposing the resist film to light passing through a mask after baking the resist film at the first temperature;

baking the resist film at a second temperature after exposing the resist film to the light, wherein the second temperature is different from the first temperature;

supplying a developing solution onto the resist film;

providing a rinsing liquid onto the substrate so as to cover the resist film; and applying ultrasonic vibration to the rinsing liquid to rinse the developing solution from the resist film submerged in the rinsing liquid.

24. A method of forming a resist pattern on a substrate, comprising:

forming a resist film on the substrate;

baking the resist film at a first temperature;

exposing the resist film to light passing through a mask after baking the resist film at the first temperature;

baking the resist film at a second temperature after exposing the resist film to the light, wherein the second temperature is different from the first temperature;

supplying a developing solution onto the resist film;

supplying the resist film formed on the substrate with a rinsing liquid; and applying ultrasonic vibration to the rinsing liquid to rinse the developing solution from the resist film submerged in the rinsing liquid.

25. A method of forming a resist pattern on a substrate, comprising:

forming a resist film on the substrate;

baking the resist film at a first temperature;

irradiating the resist film with an electron beam using an electron beam lithography technique after baking the resist film at the first temperature;

baking the resist film at a second temperature after irradiating the resist film with the electron beam, wherein the second temperature is different from the first temperature;

supplying a developing solution onto the resist film;

providing a rinsing liquid onto the substrate so as to cover the resist film; and applying ultrasonic vibration to the rinsing liquid to rinse the developing solution from the resist film submerged in the rinsing liquid.

26. A method of forming a resist pattern on a substrate, comprising:

forming a resist film on the substrate;

baking the resist film at a first temperature;

irradiating the resist film with an electron beam using an electron beam lithography technique after baking the resist film at the first temperature;

baking the resist film at a second temperature after irradiating the resist film with the electron beam, wherein the second temperature is different from the first temperature;

supplying a developing solution onto the resist film;

supplying the resist film formed on the substrate with a rinsing liquid; and applying ultrasonic vibration to the rinsing liquid to rinse the developing solution from the resist film submerged in the rinsing liquid.

* * * * *